United States Patent
Song et al.

(10) Patent No.: US 10,523,154 B2
(45) Date of Patent: Dec. 31, 2019

(54) OSCILLATOR INCLUDING VARACTOR CIRCUIT AND METHOD OF OPERATION THEREOF

(71) Applicant: Samsung Electronics Co., Ltd., Suwon-si, Gyeonggi-do (KR)

(72) Inventors: Gyeongseok Song, Busan (KR); Kang-jik Kim, Jeonju-si (KR); Chang-kyung Seong, Yongin-si (KR); Hyung-jun Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/959,432

(22) Filed: Apr. 23, 2018

(65) Prior Publication Data
US 2019/0058442 A1    Feb. 21, 2019

(30) Foreign Application Priority Data
Aug. 16, 2017   (KR) .................. 10-2017-0103713

(51) Int. Cl.
| | |
|---|---|
| H03B 5/12 | (2006.01) |
| H03L 7/099 | (2006.01) |
| H03B 5/04 | (2006.01) |
| H03L 7/097 | (2006.01) |

(52) U.S. Cl.
CPC .......... *H03B 5/1243* (2013.01); *H03B 5/04* (2013.01); *H03L 7/097* (2013.01); *H03L 7/099* (2013.01); *H03B 2200/004* (2013.01)

(58) Field of Classification Search
CPC .................................................. H03B 5/1243
USPC ........................................................ 331/117 R
See application file for complete search history.

(56) References Cited

U.S. PATENT DOCUMENTS

| | | | |
|---|---|---|---|
| 6,825,785 B1 * | 11/2004 | Huang | ............... H03L 7/093 341/141 |
| 8,217,690 B2 | 7/2012 | Hu et al. | |
| 8,253,506 B2 | 8/2012 | Liu et al. | |
| 8,466,750 B2 | 6/2013 | Chiu et al. | |
| 8,531,244 B2 | 9/2013 | Shibata et al. | |
| 9,231,519 B2 | 1/2016 | Wei et al. | |
| 9,344,100 B2 | 5/2016 | Liu et al. | |
| 9,432,028 B2 | 8/2016 | Kim et al. | |
| 9,515,625 B2 | 12/2016 | Camilleri | |
| 2006/0145776 A1 | 7/2006 | Shi et al. | |

(Continued)

FOREIGN PATENT DOCUMENTS

| | | |
|---|---|---|
| JP | 2002190709 | 7/2002 |
| JP | 2012199761 | 10/2012 |
| JP | 2016019269 | 2/2016 |

*Primary Examiner* — Joseph Chang
(74) *Attorney, Agent, or Firm* — Myers Bigel, P.A.

(57) ABSTRACT

An oscillator and method for operation of the oscillator are provided. The oscillator includes a control voltage generator configured to generate a control voltage based on dividing a power voltage that was received, an offset voltage generator configured to generate an offset voltage based on dividing the power voltage that was received, a phase locked loop (PLL) including a varactor circuit configured to modify a capacitance based on the control voltage and the offset voltage, and a calibration logic circuit configured to provide a selection control signal to the control voltage generator based on the oscillation signal, and configured to provide an offset control signal to the offset voltage generator based on the oscillation signal.

19 Claims, 13 Drawing Sheets

(56) References Cited

U.S. PATENT DOCUMENTS

| | | | |
|---|---|---|---|
| 2006/0238261 A1* | 10/2006 | Rhee | H03L 7/0898 |
| | | | 331/16 |
| 2009/0115537 A1* | 5/2009 | Ramaswamy | H03L 7/087 |
| | | | 331/44 |
| 2009/0146748 A1* | 6/2009 | Pernia | H03B 5/04 |
| | | | 331/109 |
| 2012/0249249 A1* | 10/2012 | Shen | H03L 1/02 |
| | | | 331/16 |
| 2015/0022024 A1 | 1/2015 | Dicicco et al. | |
| 2015/0349712 A1* | 12/2015 | Hung | H03B 5/1265 |
| | | | 331/117 R |
| 2016/0142063 A1* | 5/2016 | Zhang | H03L 7/093 |
| | | | 327/157 |
| 2017/0085270 A1 | 3/2017 | Suzuki et al. | |
| 2017/0264333 A1* | 9/2017 | Hoshino | H04B 1/40 |

* cited by examiner

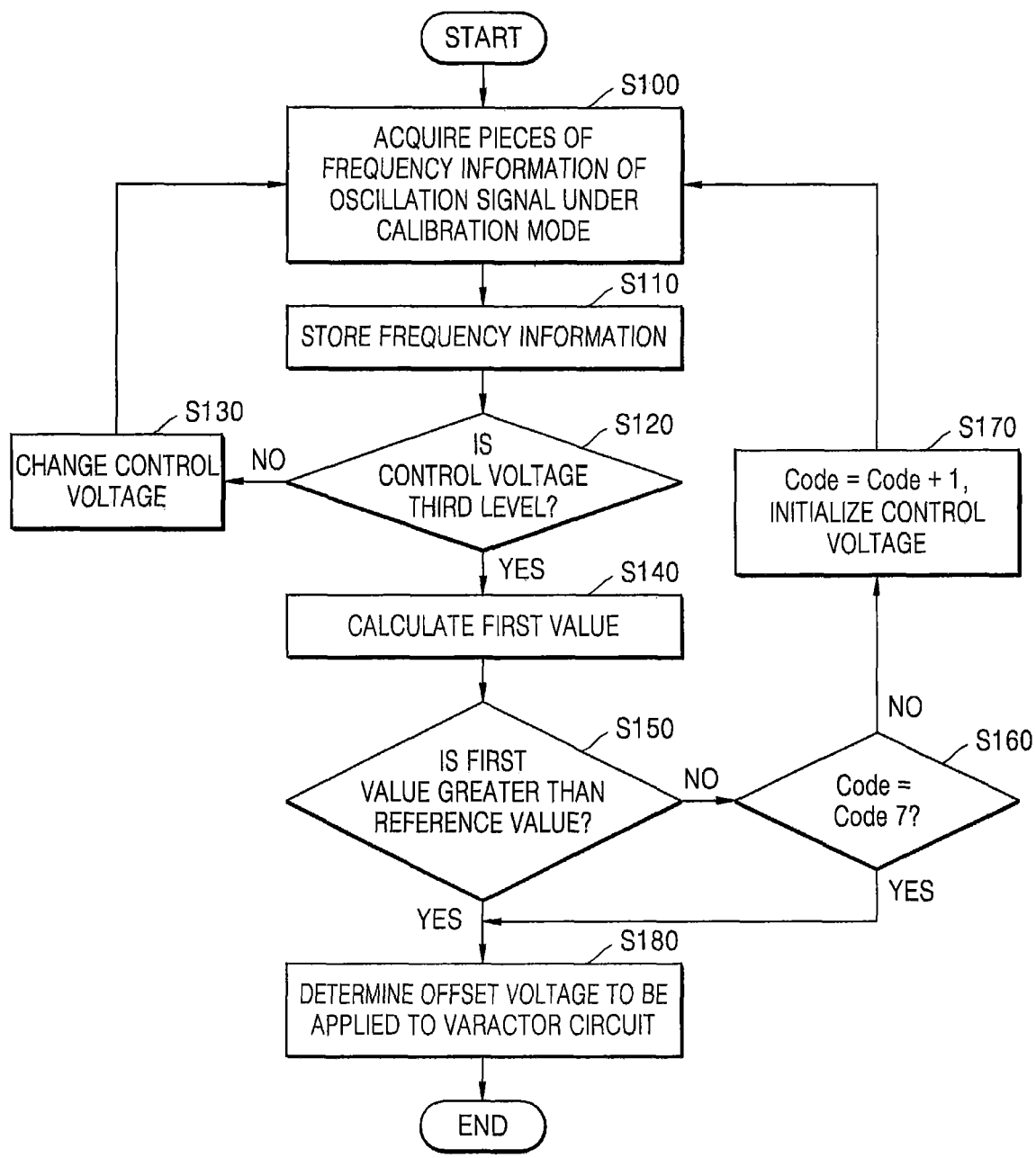

OSCILLATOR INCLUDING VARACTOR CIRCUIT AND METHOD OF OPERATION THEREOF

CROSS-REFERENCE TO RELATED APPLICATION

This U.S. non-provisional patent application claims priority under 35 U.S.C. § 119 to Korean Patent Application No. 10-2017-0103713, filed on Aug. 16, 2017, in the Korean Intellectual Property Office, the disclosure of which is incorporated herein in its entirely by reference.

BACKGROUND

The inventive concept relates to an oscillator, and more particularly, an oscillator including a varactor circuit and method of operation thereof.

An oscillator including a phase locked loop (PLL), for example, is a circuit generating oscillation signals (or clock signals) used to send data from a transmitter and restore data in a receiver. In this case, the PLL included in the oscillator may be sorted as a ring PLL, an LC-PLL, etc.

When the LC-PLL includes a varactor circuit, a resonance frequency of the LC-PLL is determined by a capacitance of the varactor circuit and an inductance of an inductor. The capacitance of the varactor circuit changes depending on control voltages, and a C-V property of the varactor circuit may be changed depending on a Process-Voltage-Temperature (PVT) change. Thus, irregularities in changes of frequencies of the oscillation signals according to the control voltages may occur.

SUMMARY

The inventive concept is related to an oscillator and methods of operation thereof, and provides an oscillator which may calibrate a capacitance of a varactor circuit under a calibration mode.

According to some embodiments, there is provided an oscillator, including a control voltage generator configured to generate a control voltage based on dividing a power voltage that was received, an offset voltage generator configured to generate an offset voltage based on dividing the power voltage that was received, a phase locked loop (PLL) including a varactor circuit configured to modify a capacitance based on the control voltage and the offset voltage, and a calibration logic circuit configured to provide a selection control signal to the control voltage generator based on the oscillation signal, and configured to provide an offset control signal to the offset voltage generator based on the oscillation signal. The PLL is configured to output an oscillation signal comprising an oscillation frequency that is responsive to the capacitance According to some embodiments, there is provided a method of operating of an oscillator including a phase locked loop that is configured to generate an oscillation signal. The phase locked loop includes a varactor circuit. The method includes acquiring frequency information associated with the oscillation signal by applying a plurality of control voltages to the varactor circuit. The varactor circuit is configured to modify a capacitance based on a control voltage and an offset voltage. The method includes modifying the offset voltage based on the frequency information, and applying the offset voltage to the varactor circuit responsive to the modifying the offset voltage. The varactor circuit is in a fixed offset voltage state under a calibration mode.

According to some embodiments, a method of operating of an oscillator includes applying a control voltage, based on a selection control signal and an offset signal responsive to a offset control signal, to a varactor circuit provided in a phase locked loop under a calibration mode. The method includes changing the selection control signal into different levels based on an oscillation signal from the phase locked loop, acquiring frequency information based on the oscillation signal from the phase locked loop, determining a first value based on the frequency information, determining whether to change the offset control signal based on the first value, and determining an offset voltage to be applied to the varactor circuit based on the offset control signal.

BRIEF DESCRIPTION OF THE DRAWINGS

Embodiments of the inventive concept will be more clearly understood from the following detailed description taken in conjunction with the accompanying drawings in which:

FIGS. 8A through 8C are diagrams used for description of operations of the calibration logic circuit according to example embodiments of the present disclosure.

DETAILED DESCRIPTION OF THE EMBODIMENTS

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Figure 1:
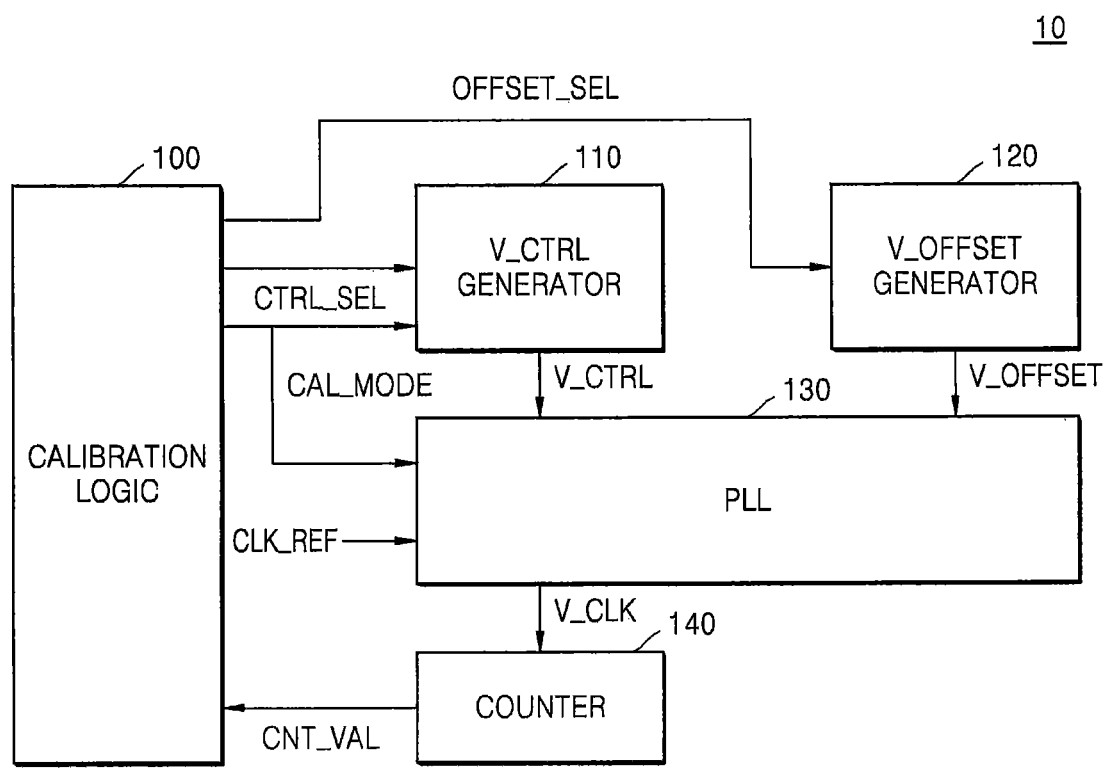
FIG. 1 is a block diagram illustrating an oscillator according to example embodiments of the present disclosure.

FIG. 1 is a block diagram illustrating an oscillator according to example embodiments of the present disclosure. With reference to FIG. 1, the oscillator 10 may include a calibration logic circuit 100, a control voltage generator 110, an offset voltage generator 120, a phase locked loop (PLL) 130 and a counter 140.

The calibration logic circuit 100 may control the oscillator 10 under a calibration mode. For example, under the calibration mode, a calibration operation with respect to a resonance frequency of the oscillator 10 may be performed. In some embodiments, the calibration logic circuit 100 may perform a calibration operation based on a capacitance of the varactor circuit included in the PLL 130.

The calibration logic circuit 100 may output calibration mode signals CAL_MODE to the control voltage generator 110 and the PLL 130. The control voltage generator 110 and the PLL 130 may perform calibration operations based on the input calibration mode signals CAL_MODE.

The calibration logic circuit 100 may output a selection control signal CTRL_SEL to the control voltage generator 110 based on frequency information about an oscillation signal V_CLK. Also, the calibration logic circuit 100 may output a offset control signal OFFSET_SEL based on the frequency information about the oscillation signal V_CLK. In an example embodiment, the frequency information about the oscillation signal V_CLK may be applied to the calibration logic circuit 100 as a counting value CNT_VAL with respect to clocks of the oscillation signal V_CLK. The counting value CNT_VAL may be incremented based on edges of the oscillation signal V_CLK The counting value CTN_VAL may be output from the counter 140 to which the oscillation signals V_CLK have been input.

In some embodiments, the selection control signal CTRL_SEL may have the form of a digital code. The selection control signal CTRL_SEL, for example, may control switches of a voltage distributor included in the control voltage generator 110. In some embodiments, the offset control signal OFFSET_SEL may have the form of a digital code. The offset control signal OFFSET_SEL, for example, may control switches of a voltage distributor included in the offset voltage generator 120. Details thereof will be described hereinafter with respect to FIGS. 4 and 5.

The calibration logic circuit 100 may determine whether to change the offset voltage V_OFFSET based on frequency information about the oscillation signal V_CLK. In some embodiments, under the calibration mode of the oscillator 10, the calibration logic circuit 100 may perform an operation determining an appropriate offset voltage V_OFFSET to be applied to the varactor circuit included in the PLL 130.

The appropriate offset voltage V_OFFSET, for example, may indicate an offset voltage V_OFFSET in which the varactor circuit included in the PLL 130 may have linearity regardless of a Process-Voltage-Temperature (PVT) change in a variable range of the control voltage V_CTRL. Also, in some embodiments, when the offset voltage V_OFFSET that is the most appropriate is not determined, the calibration logic circuit 100 may receive a value with respect to the offset control signal OFFSET_SEL from an exterior portion (for example, a host), In some embodiments, in a state where the offset control signals OFFSET_SEL are output so that the offset voltage V_OFFSET may be fixed, the calibration logic circuit 100 may acquire portions of different frequency information with respect to the oscillation signal V_CLK by changing and outputting the selection control signal CTRL_SEL so that a plurality of different control voltages V_CTRL may be applied to the PLL 130. For example, based on various portion of different frequency information, the calibration logic circuit 100 may determine a capacitance-voltage curve (C-V curve) and/or a frequency-voltage curve (F-V curve) of a varactor circuit under an offset voltage V_OFFSET that has been fixed.

The control voltage generator 110 may receive the selection control signal CTRL_SEL and the calibration mode signals CAL_MODE and output a control voltage V_CTRL to the PLL 130. In an example embodiment, the control voltage generator 110 may divide a power voltage (not shown) that is input based on the selection control signal CTRL_SEL and output as the control voltage V_CTRL. The power voltage (not shown), for example, may be output from an LDO (Low Drop Out) regulator that behaves as a DC linear voltage regulator.

The offset voltage generator 120 may receive the offset control signal OFFSET_SEL and output the offset voltage V_OFFSET to the PLL 130. In some embodiments, the control voltage generator 110 may distribute an input power voltage (not shown) based on the offset control signal OFFSET_SEL and output the offset voltage V_OFFSET. The power voltage (not shown), for example, may be output from the LDO regulator.

The PLL 130 may include a varactor circuit in which a capacitance may change based on the control voltage V_CTRL and/or the offset voltage V_OFFSET. In other words, the varactor circuit may function as a variable capacitor. The PLL 130 may output the oscillation signal V_CLK in which a frequency may be changed based on the capacitance of the varactor circuit. For example, under a normal mode, the PLL 130 may operate as a clock synchronization circuit to synchronize operation timings of exterior clock signals and interior clock signals of a semiconductor device. The external clock signals may be clock signals having a crystal clock source as a reference, but are not limited thereto.

The PLL 130 may operate in the calibration mode based on the calibration mode signals CAL_MODE. A calibration mode operation, for example, may be performed before an Auto Frequency Control (AFC) operation of the oscillator 10. However, the calibration mode operation is not limited thereto, and may be performed after the AFC operation. In some embodiments, in the calibration mode, the capacitance of the varactor circuit included in the PLL 130 may be calibrated based on the control voltage V_CTRL and the offset voltage V_OFFSET. Details thereof will be described hereinafter.

The counter 140 may count the number of clocks of the oscillation signal V_CLK output from the PLL 130, and output a counting value CNT_VAL of the clocks to the calibration logic circuit 100. The counter 140, for example, may receive reference clocks having a lower frequency than that of the oscillation signal, compare the reference clocks with the oscillation signal V_CLK and deduct a counting value CNT_VAL. In some embodiments, the counter 140 is illustrated to be separate from the calibration logic circuit 100. However, the counter 140 may be included in the calibration logic circuit 100. The counter 140, for example, may output the counting value CNT_VAL as a digital signal.

Figure 2:
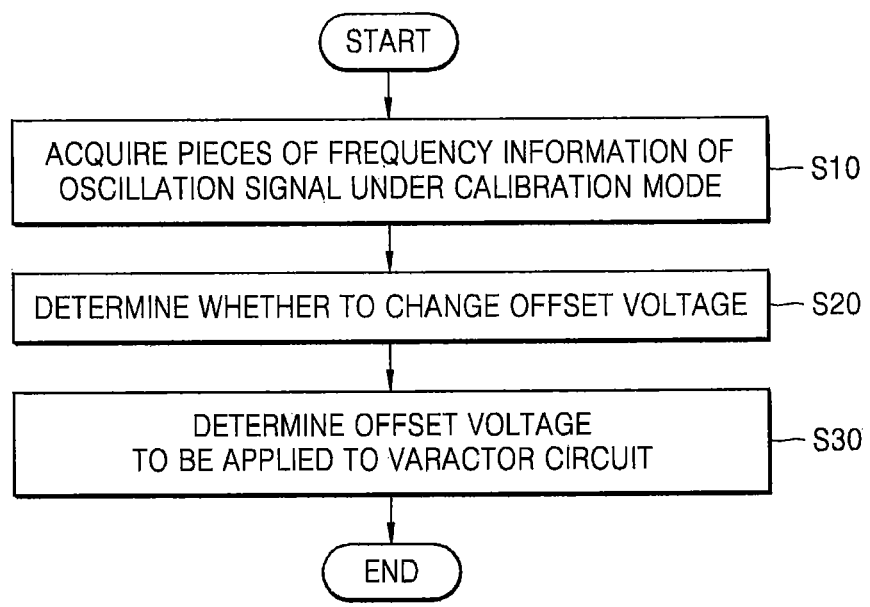
FIG. 2 is a flowchart illustrating a calibration operation of the oscillator according to an example embodiments of the present disclosure.

FIG. 2 is a flowchart illustrating a calibration operation of the oscillator according to some embodiments of the present disclosure. FIG. 2, for example, may be a flowchart of operations of the oscillator 10 in FIG. 1 under the calibration mode.

With reference to FIG. 2, the calibration logic circuit 100 may acquire frequency information about the oscillation signal V_CLK output from the PLL 130 (S10). In some embodiments, the frequency information may include frequency information with respect to the plurality of different power voltages V_CTRL in a state where the offset voltage V_OFFSET is fixed. The frequency information, for example, may be the counting values CNT_VAL for the clocks of the oscillation signal V_CLK.

Next, the calibration logic circuit 100 may determine whether to change or adjust the offset voltage V_OFFSET (S20). In some embodiments, the calibration logic circuit 100 may calculate a first value based on the frequency information with respect to the oscillation signals V_CLK. The first value, for example, may be a value which is a parameter for determining whether to change the offset voltage V_OFFSET.

The calibration logic circuit 100 may compare the first value with a reference value and determine whether to change the offset voltage V_OFFSET. In some embodiments, when the reference value is 0, the calibration logic circuit 100 may change the offset voltage V_OFFSET, initialize the control voltage V_CTRL and obtain another set of the frequency information about the oscillation signals V_CLK when the first value is less than the reference value. In other words, when the first value is less than the reference value, the calibration logic circuit 100 may determine that the offset voltage V_OFFSET is not completely changed.

Also, when the reference value is 0, the calibration logic circuit 100 may determine not to change the offset voltage V_OFFSET. In other words, when the first value is greater than the reference value, the calibration logic circuit 100 may determine that the offset voltage V_OFFSET is completely changed.

Next, the calibration logic circuit 100 may determine the offset voltage V_OFFSET to be applied to the varactor circuit included in the PLL 130. In some embodiments, the calibration logic circuit 100 may determine a fixed offset voltage V_OFFSET as the offset voltage V_OFFSET to be applied to the varactor circuit when the first value is close to the reference value.

Figure 3:
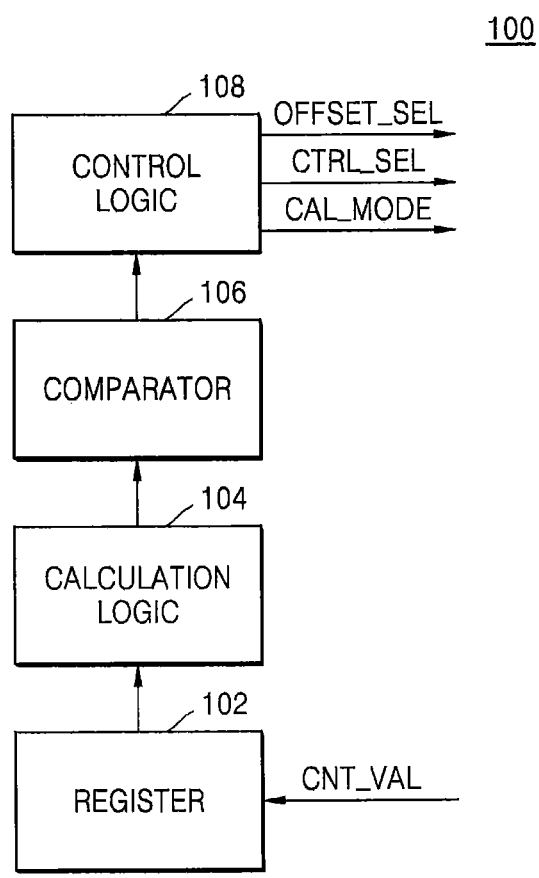
FIG. 3 is a block diagram illustrating a calibration logic circuit according to example embodiments of the present disclosure.

FIG. 3 is a block diagram illustrating the calibration logic circuit according to some embodiments of the present disclosure.

With reference to FIG. 3, the calibration logic circuit 100 may include a register 102, a calculation logic circuit or calculation logic 104, a comparator circuit or a comparator 106 and a control logic circuit or control logic 108. The calibration logic circuit 100, for example, may be a digital circuit performing operations according to input and output of at least one digital signal, but is not limited thereto.

The register 102 may receive the counting values CNT_VAL and temporarily store the received counting values CNT_VAL. The register 102, for example, may include at least one flip-flop. In some embodiments, in a state where the offset voltage (V_OFFSET in FIG. 1) is fixed, the register 102 may temporarily store the counting values CNT_VAL with respect to the clocks of the oscillation signals (V_CLK in FIG. 1) output in one or more cases where different levels of control voltages V_CTRL are applied to the PLL 130.

The counting values CNT_VAL stored in the register 102 may be transferred to the calculation logic 104. The calculation logic 104 may calculate the first value based on the counting values CNT_VAL transferred from the register 102. The first value, for example, may be a parameter for determining whether to change the offset voltage (V_OFFSET in FIG. 1). In other words, the first value may be a parameter for determining whether the control logic 108 may change the offset control signal OFFSET_SEL. The calculation logic 104 may calculate the first value and then output data regarding the first value to the comparator 106.

The comparator 106 may receive the data regarding the first value output from the calculation logic 104 and compare the first value with the reference value. In some embodiments, the reference value may be '0'. The comparator 106 may determine whether the first value is greater than the reference value and output a result from the determination to the control logic 108.

The control logic 108 may output the selection control signal CTRL_SEL and/or the offset control signal OFFSEL_SEL based on the result output from the comparator 106. In some embodiments, when the first value is less than the reference value, the control logic 108 may change and output the offset control signal OFFSET_SEL. In other words, when the first value is less than the reference value, the offset voltage (V_OFFSET in FIG. 1) applied to the varactor circuit may be changed.

When the first value is less than the reference value, in a state where the offset voltage (V_OFFSET in FIG. 1) is fixed, the calibration logic circuit 100 may re-obtain the frequency information about the oscillation signals (V_CLK in FIG. 1) output in one or more cases where different levels of control voltages are applied to the PLL 130. Accordingly, the calibration logic circuit 100 may determine the C-V curve and/or the F-V curve in a state where the offset voltage V_OFFSET is fixed.

In some embodiments, when the first value is greater than the reference value, the control logic 108 may not change the offset control signal OFFSET_SEL. In other words, when the first value is greater than the reference value, the offset voltage (V_OFFSET in FIG. 1) to be applied to the varactor may not be changed.

When the first value is greater than the reference value, the control logic 108 may control the offset voltage (V_OFFSET in FIG. 1) to be applied to the varactor circuit to be determined by determining the offset control signal OFFSET_SEL. In other words, when the first value is greater than the reference value, the control logic 108 may determine the offset control signal OFFSET_SEL for the offset voltage (V_OFFSET in FIG. 1) to be applied to the varactor circuit under the normal mode.

In some embodiments, when the first value is greater than the reference value, the control logic 108 may determine one of either the offset control signal that is being output or the offset control signal which has been previously output as the offset control signal OFFSET_SEL to be output under the normal mode. The control logic 108, for example, between the offset control signal that is being output and the offset control signal that has been previously output, may determine the offset control signal which has the first value closer to the reference value as the offset control signal OFFSET_SEL to be output under the normal mode.

Figure 4:
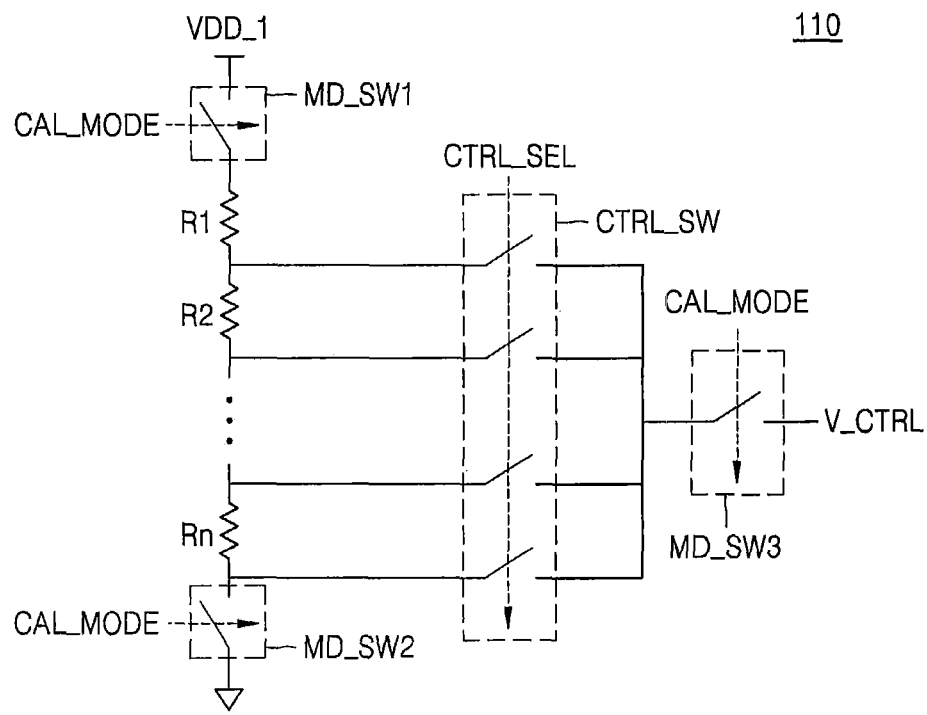
FIG. 4 is a circuit diagram of a control voltage generator according to example embodiments of the present disclosure.

FIG. 4 is a circuit diagram of a control voltage generator according to some embodiments of the present disclosure.

With reference to FIG. 4, the control voltage generator 110 may include first through third mode switches MD_SW1 through MD_SW3, a plurality of resistors R1 through Rn and one or more control switches CTRL_SW. The plurality of resistors R1 through Rn and the control switches CTRL_SW may compose a voltage distribution circuit. The voltage distribution circuit illustrated in FIG. 4 is one of many probable forms, and various kinds of voltage distribution circuits may be composed according to arrangements of the plurality of resistors R1 through Rn and the control switches CTRL_SW.

The first through third mode switches MD_SW1 through MD_SW3 may be turned on/off based on the calibration mode signals CAL_MODE. For example, each of the first through third mode switches MD_SW1 through MD_SW3 may include a transistor controlled based on the calibration mode signals CAL_MODE. Under the calibration mode, the calibration mode signals CAL_MODE may turn on the first through third mode switches MD_SW1 through MD_SW3.

The calibration mode signals CAL_MODE may be signals output from the calibration logic circuit (for example, 100 in FIG. 1). In some embodiments the same signals are applied to the first through third mode switches MD_SW1 through MD_SW3. However, as another example, complementary signals may be applied to at least two of the first through third mode switches MD_SW1 through MD_SW3.

Each of the control switches CTRL_SW may be turned on/off based on the selection control signal CTRL_SEL. In some embodiments, the selection control signal CTRL_SEL may be a digital code. When the selection control signal CTRL_SEL is a digital code, the selection control signal CTRL_SEL may include data regarding addressing of switches to be turned on and switches to be turned off among the control switches CTRL_SW.

In other words, based on the selection control signal CTRL_SEL, the control voltage generator 110 may distribute the power voltage VDD_1 and output the control voltage. The power voltage VDD_1, for example, may be output from the LDO (not shown).

Figure 5:
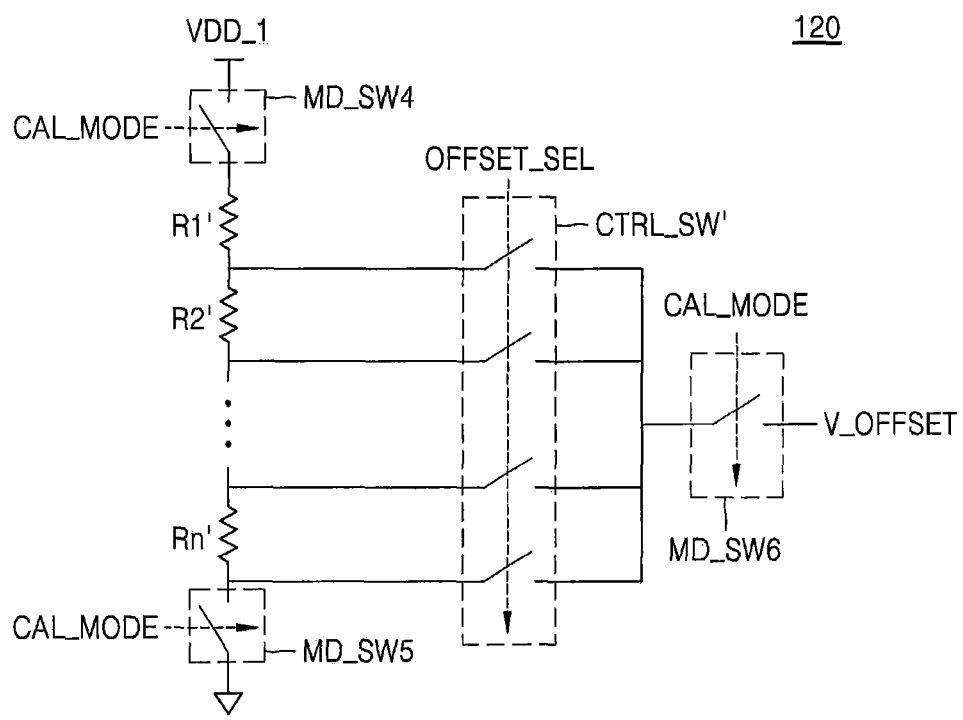
FIG. 5 is a circuit diagram of an offset voltage generator according to example embodiments of the present disclosure.

FIG. 5 is a circuit diagram of an offset voltage generator according to some embodiments of the present disclosure.

With reference to FIG. 5, the offset voltage generator 120 may include fourth through sixth mode switches MD_SW4 through MD_SW6, a plurality of resistances R1' through Rn' and control switches CTRL_SW'. As illustrated in FIG. 5, the offset voltage generator 120 may include a configuration of a voltage distribution circuit similar to the control voltage generator 110. However, like the control voltage generator 110, the voltage distribution circuit illustrated FIG. 5 is one of many probable forms, and various kinds of voltage distribution circuits may be composed according to arrangements of the plurality of resistances R1' through Rn' and the control switches CTRL_SW'.

The fourth through sixth mode switches MD_SW4 through MD_SW6 may be turned on/off based on the calibration mode signals CAL_MODE. For example, each of the fourth through sixth mode switches MD_SW4 through MD_SW6 may include a transistor controlled based on the calibration mode signals CAL_MODE. Under the calibration mode, the calibration mode signals CAL_MODE may turn on the fourth through sixth mode switches MD_SW4 through MD_SW6.

Even though not illustrated, the fourth through sixth mode switches MD_SW4 through MD_SW6 may be turned on/off based on normal mode signals. For example, each of the fourth through sixth mode switches MD_SW4 through MD_SW6 may include a transistor controlled based on at least one of the calibration mode signals CAL_MODE and the normal mode signals. Under the normal mode, the normal mode signals may turn on one or more of the fourth through sixth mode switches MD_SW4 through MD_SW6.

Each of the control switches CTRL_SW' may be turned on/off based on the offset control signal OFFSET_SEL. In some embodiments, the offset control signal OFFSET_SEL may be a digital code. When the offset control signal OFFSET_SEL is a digital code, the offset control signal OFFSET_SEL may include data regarding switches to be turned on and switches to be turned off among the control switches CTRL_SW'.

In other words, the offset voltage generator 120 may distribute the power voltage VDD_1 based on the offset control signal OFFSET_SEL and output an offset voltage. The power voltage VDD_1, for example, may be output from the LDO (not shown).

Figure 6:
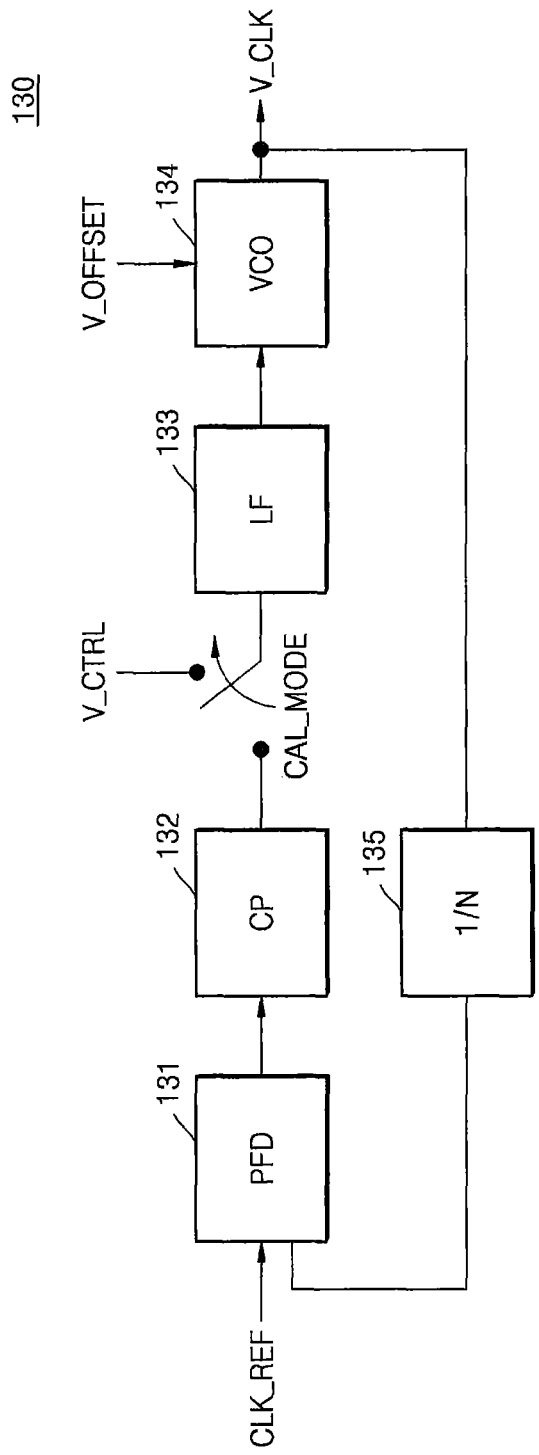
FIG. 6 is a block diagram illustrating a PLL according to example embodiments of the present disclosure.

FIG. 6 is a block diagram illustrating the PLL according to some embodiments of the present disclosure.

With reference to FIG. 6, the PLL 130 may include a phase/frequency detector 131, a charge-pump 132, a loop filter 133, a voltage controlled oscillator 134 and a frequency demultiplier 135.

Under the normal mode of operation, the phase/frequency detector 131, the charge-pump 132 and the frequency demultiplier 135 may form a feedback loop together with the loop filter 133 and the voltage controlled oscillator 134. Under the normal mode, the PLL 130 may output oscillation signals V_CLK synchronized with a reference clock signal CLK_REF through repeated operations of the feedback loop. The reference clock signal CLK_REF may be a clock signal having crystal as a reference. Synchronization of the reference clock signal CLK_REF and the oscillation signals V_CLK may be referred to as "a Phase/frequency locking".

As the calibration mode signals CAL_MODE are applied, the charge-pump 132 and the loop filter 133 may be disconnected from one another, and the control voltage V_CTRL may be input to the loop filter 133. In other words, under the calibration mode, the feedback loop formed by the phase/frequency detector 131, the charge-pump 132, the loop filter 133, the voltage controlled oscillator 134 and the frequency demultiplier 135 may be removed, and the control voltage V_CTRL may be applied in place of an output of the charge-pump 132 to the loop filter 13. The control voltage V_CTRL, for example, may be output from the control voltage generator (110 in FIG. 1)

Under the calibration mode of operation, the loop filter 133 may perform filtering on the control voltage V_CTRL. For example, the loop filter 133 may filter high frequency components included in the control voltage V_CTRL and output by the voltage controlled oscillator 134. The loop filter 133, for example, may include a low pass filter.

Under the calibration mode of operation, the voltage controlled oscillator 134 may generate the oscillation signals V_CLK based on the control voltage V_OFFSET which are filtered. The offset voltage V_OFFSET, for example, may be output from the offset voltage generator (120 in FIG. 1)

In a state where the offset voltage V_OFFSET is fixed, the voltage controlled oscillator 134 may generate an oscillation signal V_CLK having a frequency corresponding to a voltage level of the filtered control voltage V_CTRL. For example, the voltage controlled oscillator 134 may generate the oscillation signal V_CLK having a high frequency to correspond to the control voltage V_CTRL with a high voltage level and/or the oscillation signal V_CLK having a low frequency to correspond to the control voltage V_CTRL with a low voltage level.

However, such relationships between the voltage level of the control voltage V_CTRL and the frequency of the oscillation signal V_CLK may vary according to a design of the voltage controlled oscillator 134. For example, the voltage controlled oscillator 134 may generate an oscillation signal V_CLK having a high frequency to correspond to the control voltage V_CTRL of a low voltage level or an oscillation signal V_CLK having a low frequency to correspond to the control voltage_CTRL with a high voltage level.

Figure 7A:
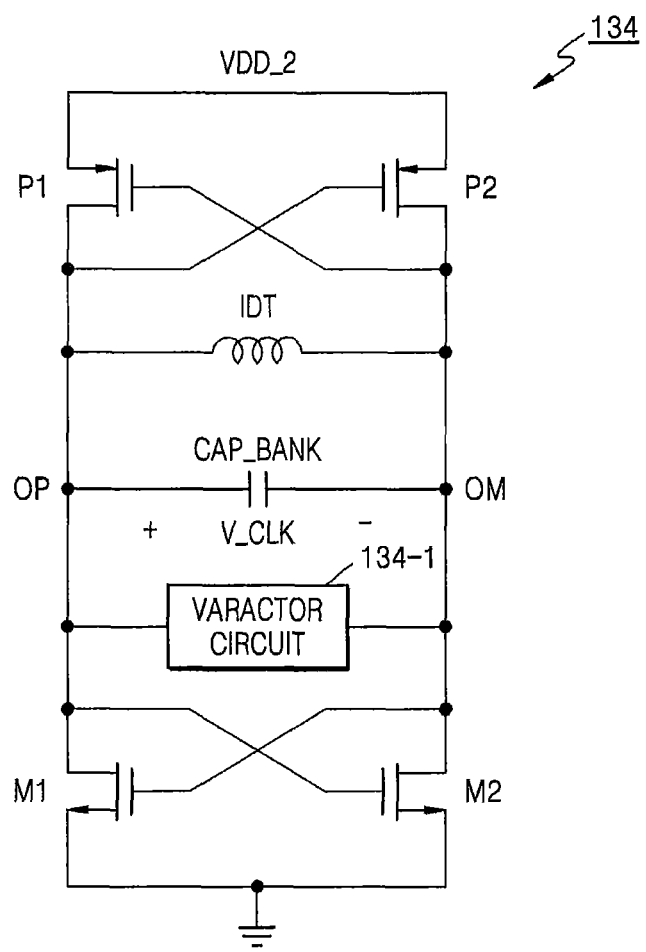
FIG. 7A is a circuit diagram of a voltage controlled oscillator according to example embodiments of the present disclosure.
Figure 7B:
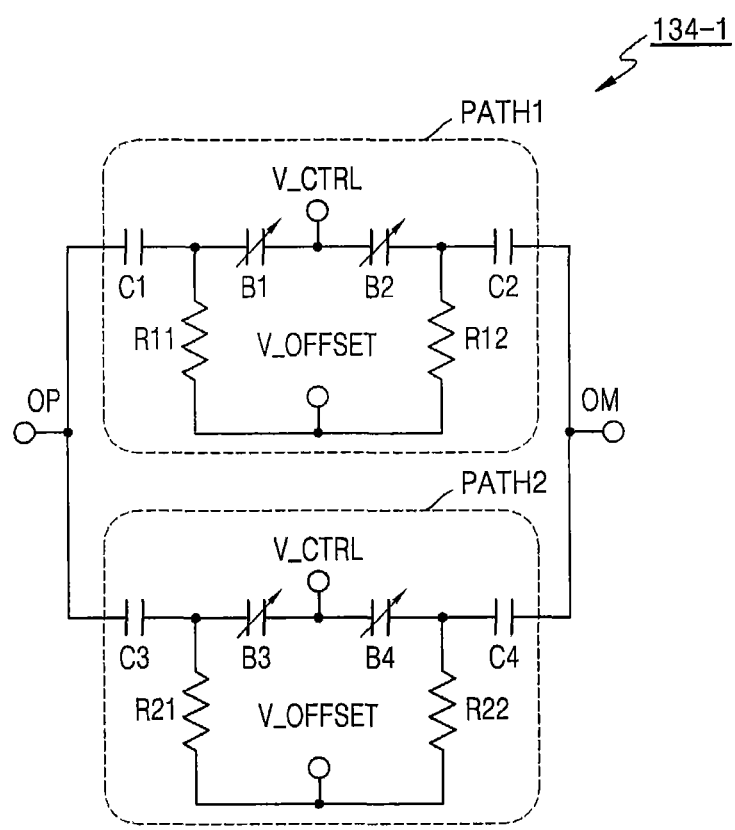
FIG. 7B illustrates a varactor circuit included in the voltage controlled oscillator according to example embodiments of the present disclosure.
Figure 7C:
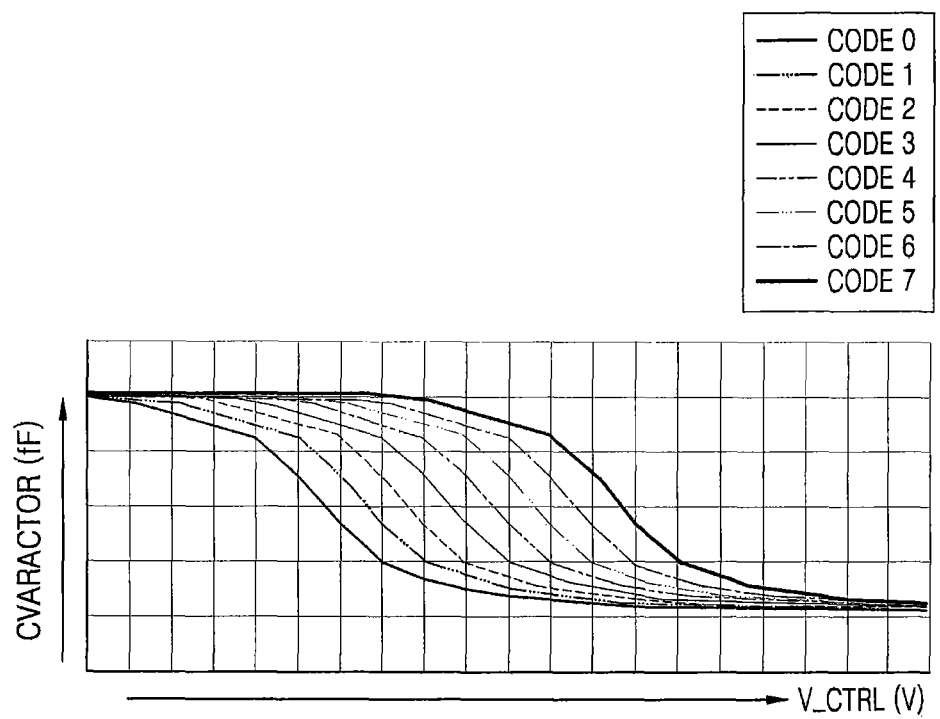
FIG. 7C is a graph showing capacitances of the varactor circuit with respect to a control voltage according to example embodiments of the present disclosure.

FIG. 7A is a circuit diagram of the voltage controlled oscillator according to some embodiments of the present disclosure. FIG. 7B is a varactor circuit included in the voltage controlled oscillator according to some embodiments of the present disclosure. FIG. 7C is a graph illustrating capacitances of the varactor circuit with respect to the control voltage according to some embodiments of the present disclosure. The circuit diagram of FIG. 7A, for example, may be the circuit diagram of the voltage controlled oscillator 134 in FIG. 6, and the circuit diagram in FIG. 7B, for example, may be a circuit diagram of a varactor circuit 134-1 illustrated in FIG. 7A. Also, the graph illustrated in FIG. 7C, for example, may be a graph illustrating changes in capacitances with respect to the control voltages V_CLK of the varactor circuit 134-1 illustrated in FIG. 7A.

First, with reference to FIG. 7A, the voltage controlled oscillator 134 may include first and second PMOS transistors P1 and P2, first and second NMOS transistors N1 and N2, and an inductor IDT, a bank-capacitor CAP_BANK, and the varactor circuit 134-1. The first and second PMOS transistors P1 and P2 may be cross-linked. In other words, a gate of the first PMOS transistor P1 may be connected to a drain of the second PMOS transistor P2, and a gate of the second PMOS transistor P2 may be connected to a drain of the first PMOS transistor P1. Also, the sources of the first and second PMOS P1 transistor and P2 may be connected to a power voltage VDD_2.

The first and second NMOS transistors N1 and N2 may be cross-linked. In other words, a gate of the first NMOS transistor N1 may be connected to a drain of the second NMOS transistor N2, and a gate of the second NMOS transistor N2 may be connected to a drain of the first NMOS transistor N1. Also, sources of the first and second NMOS transistor may be connected to ground.

Cross-linkage units of the first and second PMOS transistors P1 and P2, cross-linkage units of the first and second NMOS transistors, the inductor IDT, the bank-capacitor CAP_BANK, and the varactor circuit 134-1 may be connected in parallel between the first node OP and the second node OM. The voltage controlled oscillator 134 may output a differential signal which is an analog sign wave via the first node OP and the second node OM. In other words, signals output via the first node OP and the second node OM may compose the oscillation signals V_CLK.

For example, the oscillation signal V_CLK having an approximate target frequency may be output by adjusting a capacitance of the bank-capacitor CAP_BANK. Next, the oscillation signal V_CLK having an actual target frequency may be output by adjusting a capacitance of the varactor circuit 134-1. In this case, the frequencies of the oscillation signals V_CLK may be determined according to an equation provided below.

$$(\text{Frequency}) = \frac{1}{2 \times \pi \sqrt{L \times (C_{bank} + C_{varactor})}}$$ [Equation 1]

In [Equation 1], L may be an inductance of the inductor IDT, $C_{bank}$ may be the capacitance of the bank-capacitor CAP_BANK, and $C_{varactor}$ may be the capacitance of the varactor circuit 134-1.

With reference to FIG. 7B, the varactor circuit 134-1 may include a first path PATH1 and a second path PATH2. The first path PATH1 and the second path PATH2 may be connected in parallel between the first node OP and the second node OM. For example, under the calibration mode, same control voltages V_CTRL and same offset voltages V_OFFSET may be applied to the first path PATH1 and the second path PATH2.

The first path PATH 1 may include first and second varactors B1 and B2, first and second capacitors C1 and C2, and a plurality of resistors R11 and R12. First and second varactors B1 and B2 may function as variable capacitors. The control voltage V_CTRL may be applied to an end of each of the first and second varactors B1 and B2 at a terminal between B1 and B2. The offset voltages V_OFFSET may be applied to an end of each of the plurality of resistors R11 and R12.

The second path PATH2 may include third and fourth varactors B3 and B4, third and fourth capacitors C3 and C4 and a plurality of resistors R21 and R22. The control voltages V_CTRL may be applied to an end of each of the third and fourth varactors B3 and B4 at a terminal between B3 and B4. The offset voltages V_OFFSET may be applied to an end of each of the plurality of resistors R21 and R22.

With reference to FIG. 7C, the X axis of the graph represents a voltage level of the control voltage V_CTRL applied to the varactor circuit 134-1, and the level of the voltage may increase in a direction of the arrow. The Y axis of the graph represents a capacitance of the varactor circuit 134-1, and the capacitance may increase in a direction of the arrow.

The plurality of codes CODE 0 through Code 7 illustrated in FIG. 7C may be codes included in the offset control signal OFFSET_SEL which is applied to an offset voltage generator (for example, 120 in FIG. 1, which will be referred to as 120 hereinafter). The plurality of codes CODE 0 through Code 7 may be basis for output of the offset voltage V_OFFSET from the offset voltage generator 120. For example, as the code is changed from CODE 0 to Code 7, a level of the offset voltage V_OFFSET output from the offset voltage generator 120 may gradually increase. However, it is not limited thereto, and as the code is changed from CODE 0 to Code 7, the level of the offset voltage V_OFFSET output from the offset voltage generator 120 may generally decrease. In other words, the capacitance of the varactor circuit 134-1 may be changed according to the offset voltage V_OFFSET.

In some embodiments, the plurality of codes CODE 0 through Code 7 may control the plurality of switches included in the voltage distribution circuit provided in the offset voltage generator 120. In some embodiments, the number of codes is 8, which may be represented by three digital bits. However, this example is for convenience of description and not limited thereto.

The capacitance of the varactor circuit 134-1 may be changed according to the control voltage V_CTRL. More particularly, the capacitance of the varactor circuit 134-1 may tend to decrease as the control voltage V_CTRL increases in a state where the code is fixed. In other words, in a state where the offset voltage V_OFFSET applied to the varactor circuit 134-1 is fixed, the graph of the capacitance of the varactor circuit 134-1 with respect to the control voltage V_CTRL applied to the varactor circuit 134-1 may tend to decrease.

When the code is changed, a change pattern of the graph of the capacitance of the varactor circuit 134-1 with respect to the control voltage V_CTRL may be maintained, and a graph corresponding to each code may entirely move along the X axis. For example, when the code gradually changes from CODE 0 to Code 7, the graph corresponding to each code may move in the right direction along the X axis.

Figure 8B:
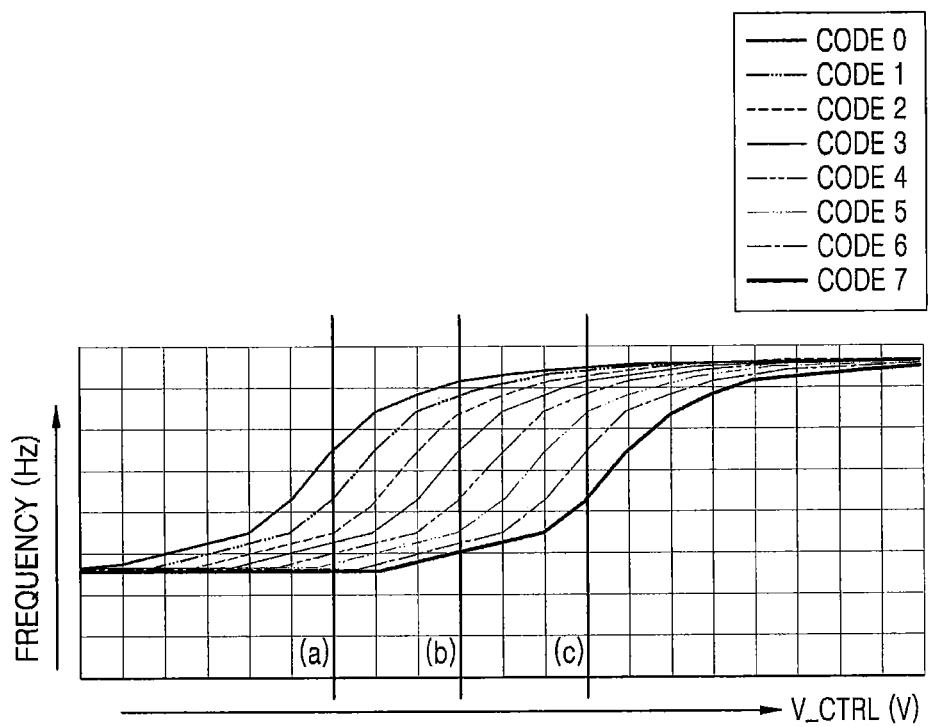
Figure 8C:
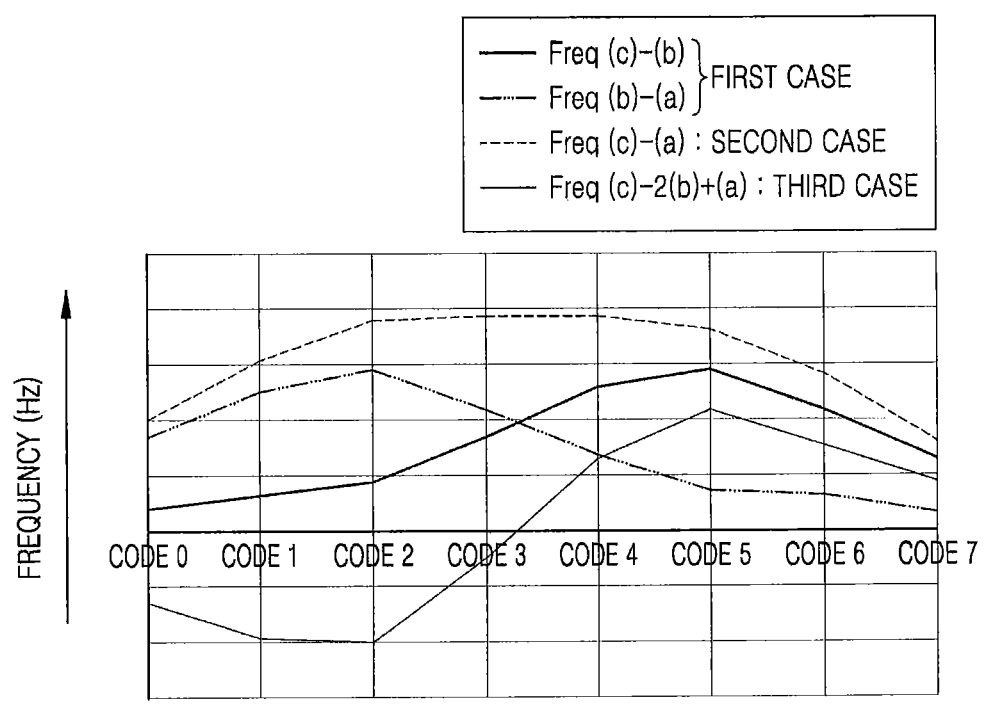

FIGS. 8A through 8C are diagrams illustrating operations of the calibration logic circuit according to some embodiments of the present disclosure. More particularly, FIG. 8A is a flowchart illustrating the operations of the calibration logic circuit 100. FIG. 8B is a graph illustrating a frequency change of the oscillation signal V_CLK according to the control voltage. FIG. 8C is a graph of various cases used for determining the offset voltage V_OFFSET. FIGS. 8A through 8C, for example, may be diagrams used for describing the operations of the calibration logic circuit 100 illustrated in FIG. 1.

The X axis of the graph illustrated in FIG. 8B represents a voltage level of the control voltage V_CTRL applied to the varactor circuit, and the level of the voltage may increase in a direction of the arrow. A Y axis of the graph represents a frequency of the oscillation signal V_CLK, and the frequency may increase as the graph moves in a direction marked with the arrow.

In some embodiments, the frequency of the oscillation signal V_CLK may be determined based on [Equation 1] described above. Accordingly, the frequency of the oscillation signal V_CLK may tend to increase as the control voltage V_CTRL increases in a state where the code is fixed. In other words, the graph of the frequency of the oscillation signal V_CLK with respect to the control voltage V_CTRL applied to the varactor circuit may tend to increase.

When the code is changed, the graph of the frequency of the oscillation signal V_CLK with respect to the control voltage V_CTRL may maintain a similar pattern. However, the graph corresponding to each code may entirely move along the X axis. For example, when the code is gradually changed from CODE 0 to Code 7, the graph corresponding to each code may move to the right along the X axis.

With reference to FIGS. 8A and 8B, under the calibration mode, the calibration logic circuit 100 may acquire frequency information about the oscillation signal output from the PLL 130. In some embodiments, the calibration logic circuit 100 may acquire one of first frequency information, second frequency information, and/or third frequency information in a state where the offset voltage V_OFFSET is fixed.

In some embodiments, the first frequency information may include frequency information about the oscillation signal V_CLK when the control voltage V_CTRL is a first level (a), the second frequency information may include frequency information about the oscillation signal V_CLK when the control voltage is a second level (b), the third frequency information may include frequency information about the oscillation signal V_CLK when the control voltage V_CTRL is a third level (c). The second level (b) may be higher than the first level (a), and/or the third level (c) may be higher than the second level (b).

In some embodiments, a voltage range from the first level (a) to the third level (c) may be an operation range of the control voltage V_CTRL under the normal mode. For example, the first level (a) may be a lowest level of the control voltage V_CTRL under the normal mode. The third level (c) may be a highest level of the control voltage V_CTRL under the normal mode. In some embodiments, the second level (b) may be a medium level between the first level (a) and the third level (c).

The calibration logic circuit 100 may store the acquired frequency information (S110). The frequency information, for example, may be temporarily stored in the register (102 in FIG. 3) provided in the calibration logic circuit 100.

Next, the calibration logic circuit 100 may determine whether the control voltage V_CTRL is the third level (c) (S120). When the control voltage V_CTRL is not the third level (c), the calibration logic circuit 100 may change the level of the control voltage V_CTRL (S130).

In some embodiments, when the control voltage V_CTRL is the first level (a), the calibration logic circuit 100 may output the selection control signal CTRL_SEL so that the control voltage V_CTRL may be the second level (b). Also, when the control voltage V_CTRL is the second level (b), the calibration logic circuit 100 may output the selection control signal CTRL_SEL so that the control voltage V_CTRL may be the third level (c). The output of the selection control signal CTRL_SEL, for example, may be performed by the control logic (108 in FIG. 3).

When the control voltage V_CTRL is the third level (c), the calibration logic circuit 100 may calculate the first value (S140). The calculation of the first frequency value, also referred to as the first value, for example, may be performed from the calculation logic (104 in FIG. 3). The first value may be determined based on the first through third frequency information. In some embodiments, the first value may be determined according to an equation provided below.

First value=third frequency information−(2×second frequency information)+first frequency information [Equation 2]

After calculating the first value, the calibration logic circuit 100 may compare the first value and the reference value. Comparison between the first value and the reference value, for example, may be performed in the comparator (106 in FIG. 3). In some embodiments, the reference value may be '0'.

When the first value is less than the reference value, the calibration logic circuit 100 may confirm whether a current code is Code 7. When the current code is not Code 7, the calibration logic circuit 100 may change the code to a next code and initialize the control voltage V_CTRL. Changes of the code and initialization of the control voltage V_CTRL, for example, may be performed in the control logic (108 in FIG. 3).

By changing the code, the calibration logic circuit 100 may control an offset voltage V_OFFSET corresponding to the next code of the current code to be applied to the varactor circuit of the PLL 130. For example, the calibration logic circuit 100 may gradually change the code in a range from CODE 0 to Code 7.

When the first value is greater than the reference value, the calibration logic circuit 100 may determine the offset voltage V_OFFSET to be applied to the varactor circuit. Determination on the offset voltage V_OFFSET, for example, may be performed in the control logic (108 in FIG. 3).

In some embodiments, the calibration logic circuit 100 may determine the offset voltage V_OFFSET that is applied in a case when the first value is nearest to the reference value as the offset voltage V_OFFSET to be applied to the varactor circuit. The reference value, for example, may be '0'.

With reference to FIG. 8C, a first case may be a case of determining the offset voltage V_OFFSET based on (the second frequency information-the first frequency information) and/or the (third frequency information-the first frequency information). Example changes according to the code of each value with respect (to the second frequency information-the first frequency information) and/or (the third frequency information-the second frequency information) may be same as the graph illustrated in FIG. 8C. More particularly, the first case may be a case of determining a medium code between a code having a greatest value of (the second frequency information-the first frequency information) and a code having a greatest value of (the third frequency information-the second frequency information) as a code for determining the offset voltage V_OFFSET.

The second case may be an example used for determining the offset voltage V_OFFSET based on (the third frequency information-the first frequency information). Example changes according to the code of value with respect to (the third frequency information-the first frequency information) may be same as the graph illustrated in FIG. 8C. More particularly, the second case may be a case of determining the code for a greatest value of (the third frequency information-the first frequency information) as a code for determining the offset voltage V_OFFSET.

As described in [Equation 2], a third case may be an example of determining the offset voltage V_OFFSET based on the first value determined by)using the third frequency information)–(2×the second frequency information)+the first frequency information. When the first value is determined in the same way with [Equation 2], changes of the first value according to the codes may be similar to the graph illustrated in FIG. 8C.

In some embodiments, when the reference value is '0', the first value in a case where the offset voltage V_OFFSET based on Code 3 is applied to the PLL 130 may be less than the reference number. The first value in a case where the offset voltage V_OFFSET based on Code 4 is applied to the PLL 130 may be greater than the reference number. Accordingly, the calibration logic circuit 100 may select a code which has a first value corresponding nearest to the reference value among code 3 and code 4 and determine the offset voltage V_OFFSET corresponding to the selected code as an offset voltage V_OFFSET to be applied to the varactor circuit.

In some embodiments, when the calibration logic circuit 100 determines the offset voltage V_OFFSET based on the first value determined from [Equation 2] according to the third case, a length of a calibration time and the number of used registers (for example, 102 in FIG. 3) may be less than in the first case.

In some embodiments, when the calibration logic circuit 100 determines the offset voltage V_OFFSET based on the first value deduced from [Equation 2] according to the third case, the offset voltage V_OFFSET that is appropriate may be determined more accurately than in the second case.

A C-V property of the varactor circuit included in the PLL 130 may be different depending on a PVT change. With reference to the oscillator according to the present inventive concept and operation methods thereof, by controlling the capacitance of the varactor circuit to satisfy a certain C-V property even if the Process-Voltage-Temperature (PVT) changes, a frequency that is stable despite changes of an input voltage according to Spread Spectrum Clocking (SSC) functions, etc. may be generated.

Also, according to the inventive concept of the present disclosure, by calibrating the capacitance of the varactor circuit to have a most appropriate linearity with respect to an input voltage, a design of the PLL with an excellent jitter property may be facilitated.

Figure 9:
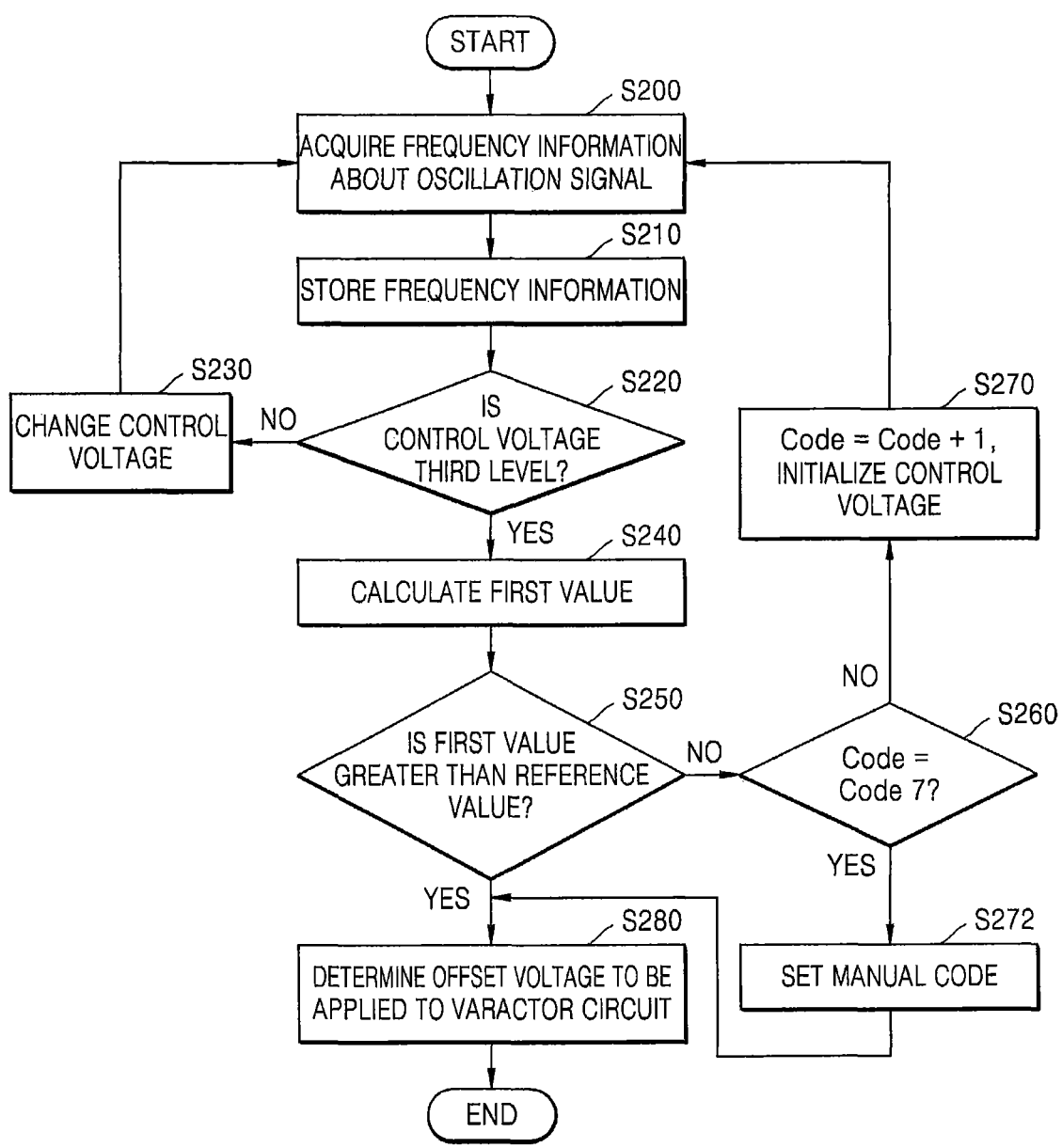
FIG. 9 is a flowchart illustrating operations of the calibration logic circuit according to example embodiments of the present disclosure.

FIG. 9 is a flowchart illustrating operations of the calibration logic circuit according to some embodiments of the present disclosure. FIG. 9, for example, may be a diagram illustrating the operations of the calibration logic circuit 100 illustrated in FIG. 1. With respect to the operations illustrated in FIG. 9, repeated descriptions already given with reference to FIG. 8A are omitted for brevity.

With reference to FIG. 9, the calibration logic circuit 100 may calculate the first value (S240), compare the first value with the reference value (S250) and confirm whether the current code is Code 7 when the first value is less than the reference value (S260). When the current code is not Code 7, the calibration logic circuit 100 may change the code to a next code and initialize the control voltage V_CTRL (S270). The offset voltage V_OFFSET to be applied to the varactor circuit may be determined (S280).

When the current code is 7, the calibration logic circuit 100 may set a manual code (S272). When the current code is 7 in a state where the first value is less than the reference value, the calibration logic circuit 100 may be in a state where the most appropriate offset voltage V_OFFSET targeted is not determined. In this case, the calibration logic circuit 100 may set a code which is a basis of the offset voltage V_OFFSET as the manual code.

In some example embodiments, the manual code may be input from the host (not shown). For example, the calibration logic circuit 100 may determine the offset voltage V_OFFSET based on the manual code input from the host.

Figure 10:
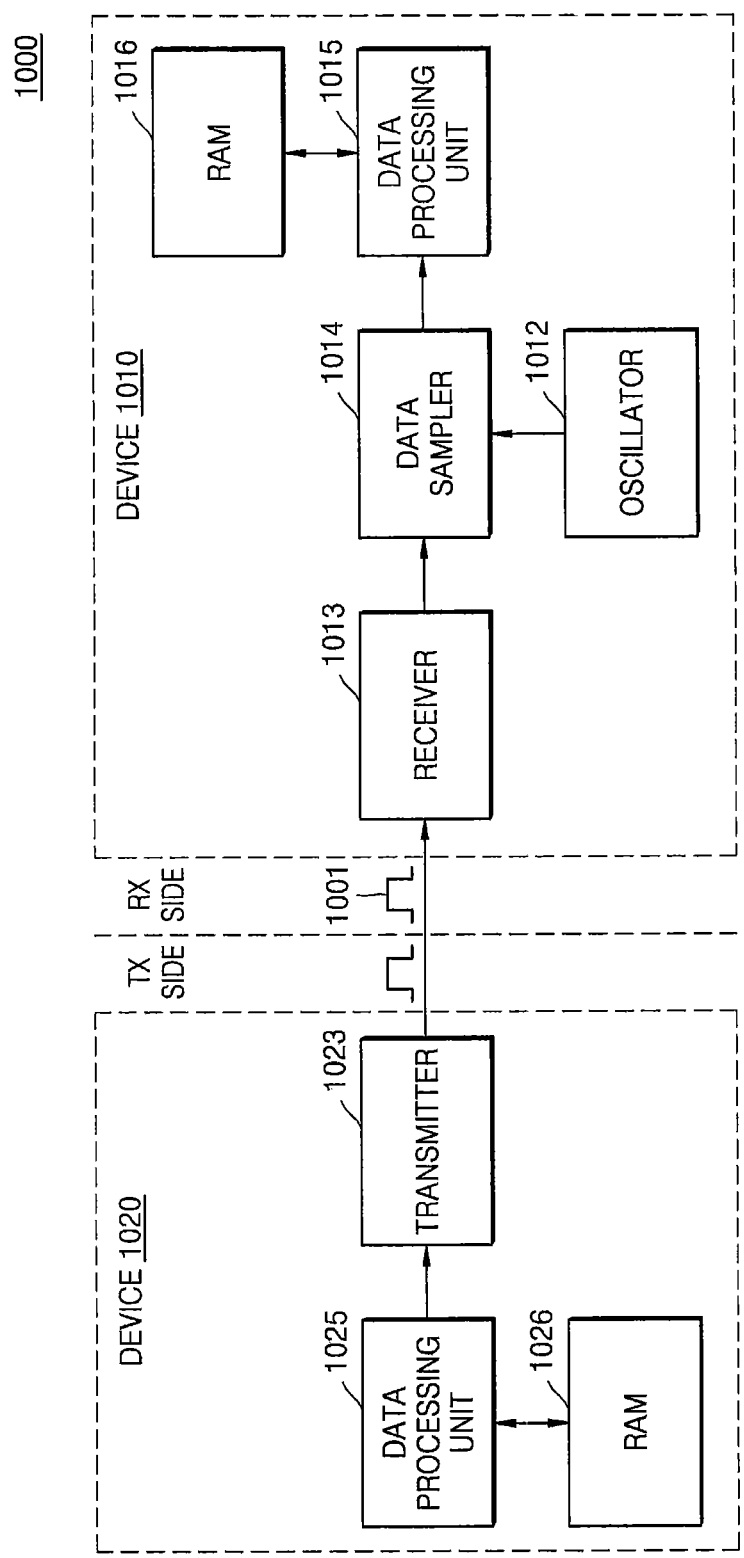
FIG. 10 is a block diagram illustrating a communication system including the oscillator according to example embodiments of the present disclosure.

FIG. 10 is a block diagram illustrating a communication system including the oscillator according to some embodiments of the present disclosure.

With reference to FIG. 10, a system 1000 may include a first apparatus 1010 and a second apparatus 1020, that communicate with each other. The first and second apparatuses 1010 and 1020 may be processing apparatuses including computers, network elements (for example, routers, switches), portable communication devices, etc. The first apparatus 1010 may include an oscillator 1012, a receiver 1013, a data sampler 1014, a data processing unit 1015, and RAM 1016. The data processing units 1015 and 1025 may be microprocessors, processors, or Central Processing Units (CPUs). RAMs 1016 and 1026 may include Dynamic RAMs (DRAMs), Synchronous DRAMs (SDRAMs), Double Data Rate SDRAMs (DDR SDRAMs) and Static RAMs (SRAMs), etc.

A transmitter 1023 of the second apparatus 1020 may provide a data stream to the receiver 1013 of the first apparatus 1010 via a communication channel 1001. The receiver 1013 may provide the received data stream to the data sampler 1014. The oscillator 1012 may receive a reference clock signal (for example, a clock signal having crystal as a reference) and provide clock signals produced by synchronizing the reference clock signal to the data sampler 1014. The oscillator 1012 may be the first apparatus 1010 in which the calibration operation is performed on the varactor circuit according to the inventive concept described in detail through FIGS. 1 through 9. The data sampler 1014 may generate sample data by performing a data sampling operation on the data stream using the clock signals. The data sampler 1014 may provide the sample data to the data processing unit 1015. The data processing unit 1015 may process the data sample by using the RAM 1016. Also, based on a process result of the data stream, the data processing unit 1015 may measure a size of a data eye and output state data of the communication channel. Similarly, the data processing unit 1015 may perform an Eye Opening Monitor (EOM) operation.

As used herein, the term "and/or" includes any and all combinations of one or more of the associated listed items. Expressions such as "at least one of," when preceding a list of elements, modify the entire list of elements and do not modify the individual elements of the list.

While the inventive concept has been particularly shown and described with reference to embodiments thereof, it will be understood that various changes in form and details may be made therein without departing from the spirit and scope of the following claims. Portions of various embodiments described herein may be used in combination of other portions of various embodiments.

What is claimed is:

1. An oscillator, comprising:
   a control voltage generator configured to generate a control voltage based on dividing a power voltage that was received;
   an offset voltage generator configured to generate an offset voltage based on dividing the power voltage that was received;
   a phase locked loop (PLL) comprising a varactor circuit configured to modify a capacitance based on the control voltage and the offset voltage, wherein the PLL is configured to output an oscillation signal comprising an oscillation frequency based on the capacitance; and
   a calibration logic circuit configured to provide a selection control signal to the control voltage generator based on the oscillation signal, and configured to provide an offset control signal to the offset voltage generator based on the oscillation signal,
   wherein the calibration logic circuit comprises:
   a register configured to store frequency information associated with the oscillation signal;
   a calculation logic circuit configured to calculate a first value based on the frequency information stored in the register;
   a comparator circuit configured to provide a result signal responsive to determining whether the first value is greater than a reference value; and
   a control logic circuit configured to output the selection control signal and the offset control signal based on the result signal from the comparator circuit.

2. The oscillator of claim 1,
   wherein the calculation logic circuit is configured to calculate the first value based on a first frequency information, a second frequency information, and/or a third frequency information that are associated with the oscillation signal,
   wherein the first frequency information is based on a first frequency of the oscillation signal which is output responsive to a first control voltage of the control voltage and a first offset voltage of the offset voltage,
   wherein the second frequency information is based on a second frequency of the oscillation signal which is output responsive to a second control voltage of the control voltage and the first offset voltage,
   wherein the third frequency information is based on a third frequency of the oscillation signal responsive to a third control voltage of the control voltage and the first offset voltage,
   wherein the second control voltage is higher than the first control voltage, and
   wherein the third control voltage is higher than the second control voltage.

3. The oscillator of claim 2, wherein
   the first value=the third frequency information−(2*the second frequency information)+the first frequency information.

4. The oscillator of claim 2,
   wherein a level of the second control voltage is a medium level of the first control voltage and a level of the third control voltage.

5. The oscillator of claim 1,
   wherein the control voltage generator comprises a voltage distribution circuit comprising one or more resistors and one or more switches, and is configured to receive the power voltage, and
   wherein the one or more switches are controlled by the selection control signal.

6. The oscillator of claim 1,
   wherein the offset voltage generator comprises a voltage distribution circuit comprising one or more resistors and one or more switches, and is configured to receive the power voltage, and
   wherein the one or more switches are controlled by the offset control signal.

7. The oscillator of claim 1, further comprising:
   a counter that is configured to receive the oscillation signal, count clocks of the oscillation signal, and provide a result value to the calibration logic circuit.

8. The oscillator of claim 1, wherein at least one of the selection control signal and the offset control signal is a digital code.

9. A method of operating of an oscillator comprising a phase locked loop that is configured to generate an oscillation signal, wherein the phase locked loop comprises a varactor circuit, the method comprising:
   acquiring frequency information associated with the oscillation signal by applying a plurality of control voltages to the varactor circuit, wherein the varactor circuit is configured to modify a capacitance based on a control voltage and an offset voltage;
   modifying the offset voltage based on the frequency information; and
   applying the offset voltage to the varactor circuit responsive to the modifying the offset voltage,
   wherein the varactor circuit is in a fixed offset voltage state under a calibration mode.

10. The method of claim 9, wherein the acquiring the frequency information comprises:
    acquiring first frequency information associated with the oscillation signal by applying a first control voltage;
    acquiring second frequency information associated with the oscillation signal by applying a second control voltage, wherein the second control voltage is higher than the first control voltage; and
    acquiring third frequency information associated with the oscillation signal by applying a third control voltage, wherein the third control voltage is higher than the second control voltage.

11. The method of claim 10, wherein the modifying the offset voltage comprises:
    determining a first value based on the first frequency information, the second frequency information, and the third frequency information; and
    modifying the offset voltage based on the first value.

12. The method of claim 11, wherein
    the first value=the third frequency information−(2*the second frequency information)+the first frequency information.

13. The method of claim 11, wherein the modifying the offset voltage comprises:
    responsive to the first value being less than a reference value, modifying the offset voltage and acquiring the first, second, and/or third frequency information again.

14. The method of claim 13, wherein responsive to the first value being greater than the reference value, determining that the offset voltage has been completely changed.

15. The method of claim 14, wherein the reference value is '0'.

16. The method of claim 11, wherein the applying the offset voltage to the varactor circuit occurs when the first value is near a reference value.

17. A method of operating of an oscillator, the method comprising:
- applying a control voltage, based on a selection control signal and an offset signal responsive to a offset control signal, to a varactor circuit provided in a phase locked loop under a calibration mode;
- changing the selection control signal into different levels based on an oscillation signal from the phase locked loop;
- acquiring frequency information based on the oscillation signal from the phase locked loop;
- determining a first value based on the frequency information;
- determining whether to change the offset control signal based on the first value; and
- determining an offset voltage to be applied to the varactor circuit based on the offset control signal.

18. The method of claim 17, wherein the acquiring the frequency information comprises:
- changing the selection control signal to a first level, then to a second level higher than the first level, and then to a third level higher than the second level; and
- acquiring first frequency information of the oscillation signal when the selection control signal is at the first level, second frequency information of the oscillation signal when the selection control signal is at the second level, and third frequency information of the oscillation signal when the selection control signal is at the third level.

19. The method of claim 17, wherein in the determining whether to change the offset control signal occurs when the first value is less than a reference value.

* * * * *